(12) United States Patent
Thompson et al.

(10) Patent No.: US 9,005,704 B2
(45) Date of Patent: Apr. 14, 2015

(54) METHODS FOR DEPOSITING FILMS COMPRISING COBALT AND COBALT NITRIDES

(71) Applicant: Applied Materials, Inc., Santa Clara, CA (US)

(72) Inventors: David Thompson, San Jose, CA (US); Jeffrey W. Anthis, San Jose, CA (US); David Knapp, Santa Clara, CA (US); Benjamin Schmiege, Santa Clara, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 14/198,776

(22) Filed: Mar. 6, 2014

(65) Prior Publication Data

US 2014/0255606 A1  Sep. 11, 2014

Related U.S. Application Data

(60) Provisional application No. 61/773,223, filed on Mar. 6, 2013.

(51) Int. Cl.
| | |
|---|---|
| *C23C 16/14* | (2006.01) |
| *C23C 16/34* | (2006.01) |
| *H05H 1/24* | (2006.01) |
| *C23C 16/42* | (2006.01) |
| *C23C 16/18* | (2006.01) |
| *C23C 16/455* | (2006.01) |

(52) U.S. Cl.
CPC .............. *C23C 16/42* (2013.01); *C23C 16/18* (2013.01); *C23C 16/34* (2013.01); *C23C 16/45536* (2013.01); *C23C 16/45553* (2013.01)

(58) Field of Classification Search
USPC .......... 427/250, 255.393, 255.394, 569, 576, 427/578
See application file for complete search history.

(56) References Cited

U.S. PATENT DOCUMENTS

| | | | |
|---|---|---|---|
| 6,821,563 B2 | 11/2004 | Yudovsky | |
| 6,878,206 B2 | 4/2005 | Tzu et al. | |
| 6,916,398 B2 | 7/2005 | Chen et al. | |
| 7,264,846 B2 * | 9/2007 | Chang et al. | 427/248.1 |
| 7,404,985 B2 * | 7/2008 | Chang et al. | 427/248.1 |
| 7,780,785 B2 | 8/2010 | Chen et al. | |
| 2002/0081381 A1 * | 6/2002 | DelaRosa et al. | 427/255.28 |
| 2006/0141155 A1 * | 6/2006 | Gordon et al. | 427/255.19 |
| 2006/0157863 A1 * | 7/2006 | Marsh | 257/774 |
| 2008/0132050 A1 * | 6/2008 | Lavoie | 438/584 |
| 2008/0268635 A1 * | 10/2008 | Yu et al. | 438/655 |
| 2009/0029036 A1 | 1/2009 | Dussarrat | |
| 2009/0208637 A1 * | 8/2009 | Chen et al. | 427/78 |
| 2009/0246952 A1 * | 10/2009 | Ishizaka et al. | 438/653 |
| 2011/0124192 A1 * | 5/2011 | Ganguli et al. | 438/653 |
| 2012/0264291 A1 * | 10/2012 | Ganguli et al. | 438/653 |
| 2013/0059077 A1 * | 3/2013 | Thompson et al. | 427/250 |

OTHER PUBLICATIONS

Diskus, Madeleine, et al., "Thin Films of Cobalt Oxide Deposited on High Aspect Ratio Supports by Atomic Layer Deposition." Chemical Vapor Deposition, 2011, 17, 135-140.*
Klepper, K.B., et al., "Epitaxial growth of cobalt oxide by atomic layer deposition". Journal of Crystal Growth 307 (2007) 457-465.*
Kwon, Jinhee, et al., "Substrate selectivity of (t-Bu-allyl)Co(CO)3 during thermal atomic layer deposition of cobalt". Chemistry of Materials, 2012, 24, 1025-1030.*
Han, Byeol, et al., "Atomic layer deposition of cobalt oxide thin films using cyclopentadienylcobalt dicarbonyl and ozone at low temperatures". J. Vac. Sci. Technol. A 31(1), Jan./Feb. 2013, pp. 1-4.*
Danopoulos, Andreas, et al., "Aminolysis of Bis[bis(trimethylsilyl)amido]iron and -cobalt as a Versatile Route to N-Heterocyclic Carbene Complexes." Organometallics, 2011, 30, 6514-6517.*
Cantalupo, Stefanie, "Three-coordinate late transition metal fluorinated alkoxide complexes". Dalton Transactions, 2010, 39, 374-383.*
Sigel, Gary, et al., "Synthesis and Spectroscopic and X-ray Structural Characterization and Dynamic Solution Behavior of the Neutral Cobalt(II) Alkoxides . . . ". Inorganic Chemistry, vol. 26, No. 11, 1987.*

* cited by examiner

*Primary Examiner* — Bret Chen
(74) *Attorney, Agent, or Firm* — Servilla Whitney LLC

(57) ABSTRACT

Cobalt-containing films, as well as methods for providing the cobalt-containing films. Certain methods pertain to exposing a substrate surface to a precursor and a co-reactant to provide a cobalt-containing film, the first precursor having a structure represented by:

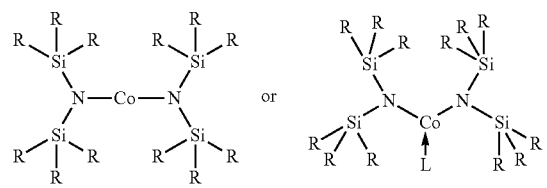

wherein each R is independently C1-C6 substituted or un-substituted alkanes, branched or un-branched alkanes, substituted or un-substituted alkenes, branched or un-branched alkenes, substituted or un-substituted alkynes, branched or un-branched alkynes or substituted or un-substituted aromatics, L is a coordinating ligand comprising a Lewis base.

20 Claims, 2 Drawing Sheets

METHODS FOR DEPOSITING FILMS COMPRISING COBALT AND COBALT NITRIDES

CROSS-REFERENCE TO RELATED APPLICATIONS

This application claims priority to U.S. Provisional Patent Application No. 61/773,223, filed Mar. 6, 2013, the entire contents of which are herein incorporated by reference.

FIELD

Embodiments of the present invention relate generally to film deposition for semiconductor devices, and methods of forming such films. More particularly, embodiments of the invention relate to films comprising cobalt and cobalt nitrides ($CoN_x$).

BACKGROUND

Deposition of thin films on a substrate surface is an important process in a variety of industries including semiconductor processing, diffusion barrier coatings and dielectrics for magnetic read/write heads. In the semiconductor industry, in particular, miniaturization requires atomic level control of thin film deposition to produce conformal coatings on high aspect structures. One method for deposition of thin films with atomic layer control and conformal deposition is atomic layer deposition (ALD), which employs sequential reactions to form layers. Most ALD processes are based on binary reaction sequences which deposit a binary compound film. Each of the two surface reactions occurs sequentially, and because they are self-limiting, a thin film can be deposited with atomic level control. Because the surface reactions are sequential, the two gas phase reactants are not in contact, and possible gas phase reactions that may form and deposit particles are limited.

ALD has been used to deposit metals and metal compounds on substrate surfaces. $Al_2O_3$ deposition is an example of a typical ALD process illustrating the sequential and self-limiting reactions characteristic of ALD. $Al_2O_3$ ALD conventionally uses trimethylaluminum (TMA, often referred to as reaction "A" or the "A" precursor) and $H_2O$ (often referred to as the "B" reaction or the "B" precursor). In step A of the binary reaction, hydroxyl surface species react with vapor phase TMA to produce surface-bound $AlOAl(CH_3)_2$ and $CH_4$ in the gas phase. In step B of the binary reaction, $AlCH_3$ of the surface-bound compound reacts with vapor phase $H_2O$ to produce AlOH bound to the surface and $CH_4$ in the gas phase. Subsequent cycles of A and B, purging gas phase reaction products and unreacted vapor phase precursors between reactions and between reaction cycles, produces $Al_2O_3$ growth in an essentially linear fashion to obtain the desired film thickness.

The typical approach to further ALD development has been to determine whether or not currently available chemistries are suitable for ALD. There is a need for new deposition chemistries that are commercially viable, particularly in the area of elemental metal films. The present invention addresses this problem by providing novel chemistries which are specifically designed and optimized to take advantage of the atomic layer deposition process. In fact, before the present invention, there were no commercially viable precursors or methods for the ALD or CVD deposition of films consisting essentially of cobalt or cobalt nitride films. There is thus a need for new deposition chemistries for such films.

SUMMARY

One aspect of the invention relates to a method of depositing a cobalt-containing film. The method comprises exposing a substrate surface to a precursor and a co-reactant to provide a cobalt-containing film, the first precursor having a structure represented by:

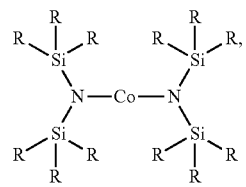

wherein each R is independently C1-C6 substituted or un-substituted alkanes, branched or un-branched alkanes, substituted or un-substituted alkenes, branched or un-branched alkenes, substituted or un-substituted alkynes, branched or un-branched alkynes or substituted or un-substituted aromatics. In one or more embodiments, each R group is methyl. In some embodiments, the R groups on a given silicon atom are not the same.

In one or more embodiments, the co-reactant comprises $NH_3$, hydrazine, a substituted hydrazine, a primary amine, a secondary amine, a tertiary amine, a $N_2$ plasma or an ammonia plasma. In some embodiments, the cobalt-containing film comprises $CoN_x$, wherein x ranges from about 0.1 to about 3.

In one or more embodiments, the co-reactant comprises a reducing agent selected from the group consisting of alane, $H_2$, $H_2$ plasma and Ar plasma. In some embodiments, the cobalt-containing film consists essentially of Co. In one or more embodiments, the substrate comprises silicon, and the cobalt-containing film comprises cobalt silicide.

In some embodiments, the method further comprises depositing a layer comprising copper over the cobalt-containing film.

Another aspect of the invention also pertains to a method of depositing a cobalt-containing film. The method comprises exposing a substrate surface to a precursor and a co-reactant, the first precursor having a structure represented by:

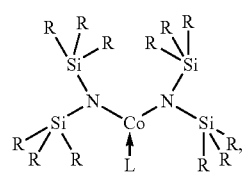

wherein each R is independently C1-C6 substituted or un-substituted alkanes, branched or un-branched alkanes, substituted or un-substituted alkenes, branched or un-branched alkenes, substituted or un-substituted alkynes, branched or un-branched alkynes or substituted or un-substituted aromatics, L is a coordinating ligand comprising a Lewis base. In some embodiments, the coordinating ligand comprises a tertiary amine. In further embodiments, the coordinating ligand comprise pyridine, tetrahydrofuran, trimethylamine or triethylamine. In one or more embodiments, each R group is methyl. In some embodiments, the R groups on a given silicon atom are not the same.

In one or more embodiments, the co-reactant comprises NH₃, hydrazine, a substituted hydrazine, a primary amine, a secondary amine, a tertiary amine, a N₂ plasma or an ammonia plasma. In some embodiments, the cobalt-containing film comprises $CoN_x$, wherein x ranges from about 0.1 to about 3.

In one or more embodiments, the co-reactant comprises a reducing agent selected from the group consisting of alane, H₂, H₂ plasma and Ar plasma. In some embodiments, the cobalt-containing film consists essentially of Co. In one or more embodiments, the substrate comprises silicon, and the cobalt-containing film comprises cobalt silicide.

In some embodiments, the method further comprises depositing a layer comprising copper over the cobalt-containing film.

Another aspect of the invention pertains to a method of depositing a cobalt-containing film, the method comprising exposing a substrate surface to a precursor and a co-reactant comprising NH₃ to provide a cobalt-containing film, the first precursor having a structure represented by:

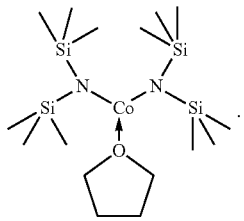

BRIEF DESCRIPTION OF THE DRAWING

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION

Figure 1:
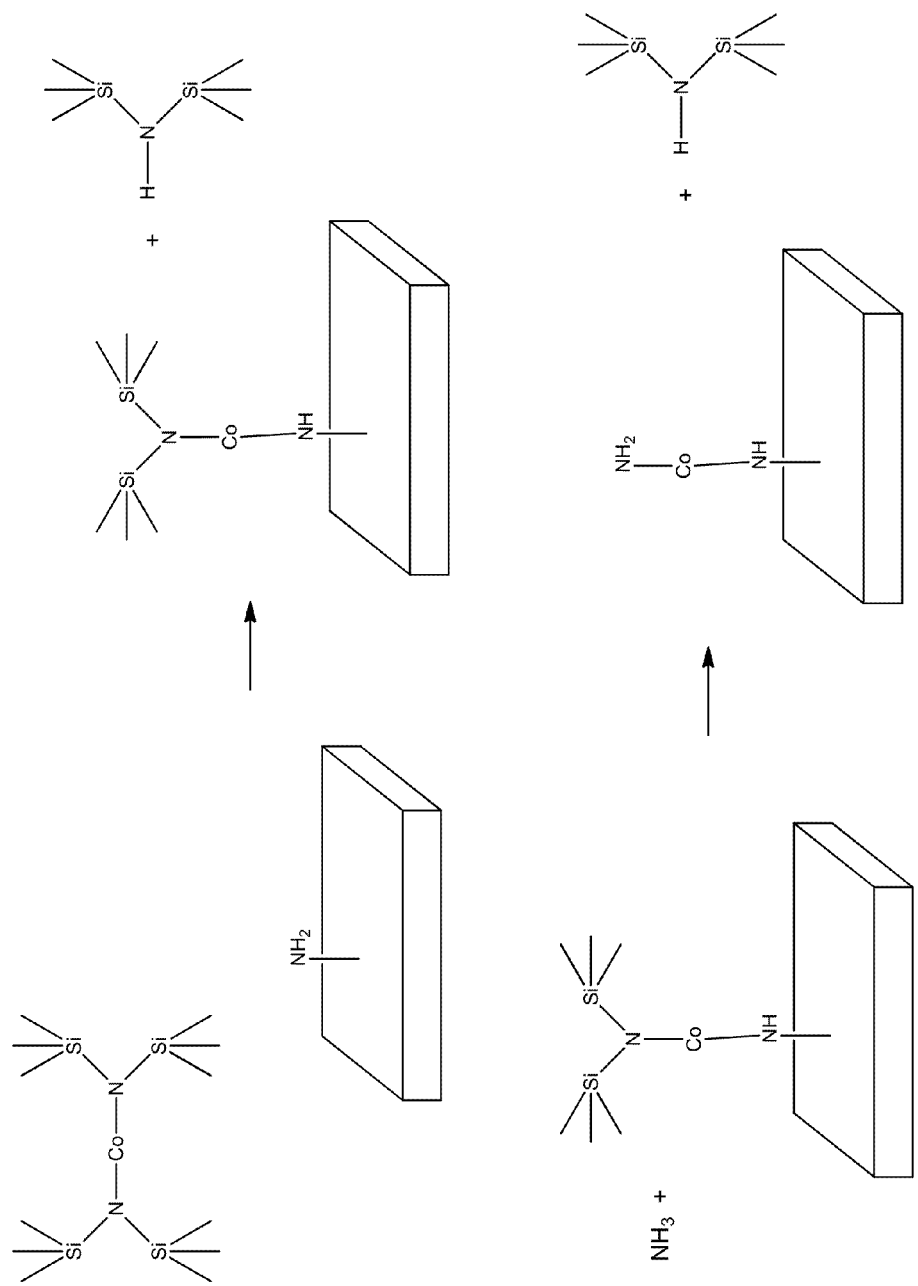
FIG. 1 shows a chemical schematic of a process in accordance with one or more embodiments of the invention.

Before describing several exemplary embodiments of the invention, it is to be understood that the invention is not limited to the details of construction or process steps set forth in the following description. The invention is capable of other embodiments and of being practiced or being carried out in various ways Embodiments of the invention relate to the production of cobalt (Co) or cobalt nitride ($CoN_x$) from organometallic precursors. The organometallic precursor may include a bis(trialkylsilyl)amido ligand, having a structure represented by:

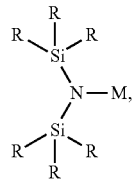

wherein R represents a hydrocarbyl group and M represents a metal (i.e. cobalt). The deposition methods can be atomic layer deposition (ALD) or chemical vapor deposition (CVD). The deposited film consisting essentially of cobalt can be used as films in the front end of the line. In some embodiments, $CoN_x$ films can be used as adhesion layers in copper interconnects.

There are few, if any, examples of CVD/ALD films of high quality and high purity $CoN_x$ or cobalt. Some precursors have extremely low vapor pressure and reaction rate, which poses challenges for chamber design and poor film morphology during ALD deposition. The precursor of some embodiments can generate a high purity $CoN_x$ film or consisting essentially of cobalt by CVD or ALD with smooth morphology.

Accordingly, one aspect of the invention relates to a method of depositing a cobalt-containing film. In one or more embodiments, the method comprising exposing a substrate surface to a precursor and a co-reactant to provide a cobalt-containing film, the first precursor having a structure represented by formulae (I) or (II):

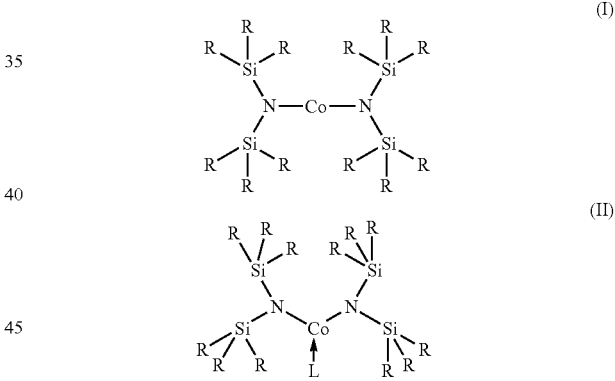

wherein each R is independently C1-C6 substituted or un-substituted alkanes, branched or un-branched alkanes, substituted or un-substituted alkenes, branched or un-branched alkenes, substituted or un-substituted alkynes, branched or un-branched alkynes or substituted or un-substituted aromatics, L is a coordinating ligand comprising a Lewis base. In some embodiments, the manganese is Mn(II) or Mn(III).

Variants of the method include utilization of various precursors. In some embodiments, the R groups are C1-C4 substituted or un-substituted alkanes, branched or un-branched alkanes, substituted or un-substituted alkenes, branched or un-branched alkenes, substituted or un-substituted alkynes, branched or un-branched alkynes or substituted or un-substituted aromatics. In one or more embodiments, the R groups on a given silicon atom may be the same. Embodiments where all of the R groups on a given ligand are methyl, the ligand is known a bis(trimethylsilyl)amido (TMSA). In further embodiments, all R groups are the same. For example, in one or more embodiments, each R group is methyl.

In other embodiments, it may be advantageous to select the R groups so that they are different on a given silicon atom, or among all of the R groups. Such embodiments may be useful as they correspond to removal of the symmetry in the precursor, thus breaking up crystallinity. This may aid in vaporization of the precursor, thereby making it available for deposition. Examples of R substituents to aid in reduction of the precursor symmetry include two methyl groups and one ethyl group on a silicon atom $(Me_2EtSi)_2N$, one methyl group and two ethyl groups on a silicon atom $(MeEt_2Si)_2N$.

Some embodiments of the invention pertain to a precursor containing a coordinating ligand. The coordinating ligand may comprise a Lewis base. In one or more embodiments, the coordinating ligand comprises a tertiary amine. In further embodiments, the coordinating ligand comprises pyridine, tetrahydrofuran (THF), trimethylamine or triethylamine.

Selection of the specific reducing agent will depend on the desired film composition. Without being bound by any particular theory of operation, it is believed that the Co—N bonds are broken during film formation. Therefore, as an example, if ammonia is used, a cobalt nitride film can be formed. Whereas, if a reducing agent is used as the co-reactant, a manganese film can be formed.

Therefore, for cobalt-containing films comprising cobalt nitride, the co-reactant will generally comprise and be a source of nitrogen. In one or more embodiments, the co-reactant comprises $NH_3$, hydrazine, a substituted hydrazine, a primary amine, a secondary amine, a tertiary amine, a $N_2$ plasma or an ammonia plasma. In some embodiments, the cobalt-containing film comprises $CoN_x$. The x of some embodiments is in the range of about 0.1 to about 3, or in the range of about 0.2 to about 2, or in the range of about 0.25 to about 1.

In embodiments where a film consisting essentially of Co is desired, the co-reactant may comprise a reducing agent. In some embodiments, the reducing agent is selected from the group consisting of alane, $H_2$, $H_2$ plasma and Ar plasma.

In some embodiments, cobalt silicide may also be formed. Cobalt silicide may be formed from deposition of a film consisting essentially of cobalt over a substrate comprising silicon. In one or more embodiments, the method further comprises a post deposition anneal. In such embodiments, a post deposition anneal might be required to form the silicide depending on the reaction conditions/temperature. In some embodiments, a film which comprises cobalt silicate may be formed. In one or more embodiments, the cobalt film comprises cobalt silicate near the dielectric surface and cobalt nitride further from the surface. The transition from the silicate to the nitride can be gradual or in discrete steps.

In some embodiments, the substrate is exposed to a first precursor and a co-reactant. The exposure to the precursor and co-reactant can be substantially simultaneously, as in a CVD reaction, or sequentially, as in an ALD reaction. As used in this specification and the appended claims, the term "substantially simultaneously" means that the two precursor gases are flowed into the chamber to react with each other and the substrate surface together. It will be understood by those skilled in the art that there may be areas of the substrate which are briefly exposed to one precursor only until the other precursor diffuses to the same area.

The vapor pressure of the precursor should be low enough to be practical in such applications. The substrate temperature should be low enough to keep the bonds of the substrate surface intact and to prevent thermal decomposition of gaseous reactants. However, the substrate temperature should also be high enough to keep the film precursors in the gaseous phase and to provide sufficient energy for surface reactions.

The specific temperature depends on the specific substrate, film precursors and pressure. The properties of the specific substrate and film precursors may be evaluated using methods known in the art, allowing selection of appropriate temperature and pressure for the reaction. In one or more embodiments, the deposition takes place at a temperature of from about 100 to about 400° C., about 150° C. to about 250° C., or about 200° C.

FIG. 1 shows a possible chemical schematic for an exemplary deposition in accordance with one or more embodiments of the invention. A bis(bis(trimethylsilyl)amido)cobalt precursor is flowed to a substrate surface. In some embodiments, the substrate surface may contain reactive functional groups, also known as "reactive handles," which can increase reactivity towards a precursor. For example, in some embodiments, and as shown in FIG. 1, The substrate surface may contain —$NH_2$ functionality. The cobalt atom in the precursor may react with a nitrogen atom on the substrate surface, producing bis(trimethylsilyl)amine as a byproduct. The bis (trimethylsilyl)amine can be purged or otherwise removed away from the substrate. A co-reactant, in this case ammonia, can then be flowed to the substrate surface. The ammonia can react with the cobalt atom to release the second bis(trimethylsilyl)amido ligand, again producing bis(trimethylsilyl) amine as a byproduct, and leaving behind the bonded cobalt atom. The byproduct may again be purged from the substrate surface. Cobalt nitride is therefore left on the substrate surface, and contains an —$NH_2$ group for reaction during the next cycle.

Another exemplary embodiment of the invention, where the precursor is coordinated to another ligand, relates to a method of depositing a cobalt-containing film, the method comprising exposing a substrate surface to a precursor and a co-reactant comprising $NH_3$ to provide a cobalt-containing film, the first precursor having a structure represented by formula (III)

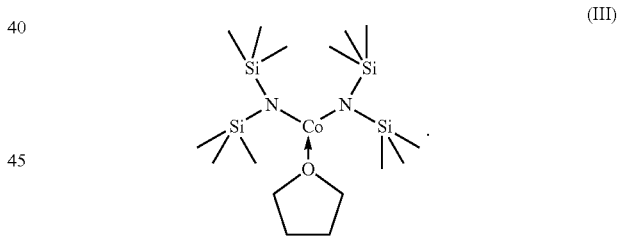

(III)

One or more of the deposition methods described herein can be used to deposit barrier, seed or adhesion layers, or used as fill material. Specifically, in one or more embodiments, $CoN_x$ may be effective as a copper seed barrier or adhesion layer, and/or a film consisting essentially of cobalt may be effective as fill material. In embodiments where the cobalt-containing film is utilized as a copper see and/or barrier layer, the methods for deposition may further comprise depositing a layer comprising copper over the cobalt-containing film.

Figure 2:
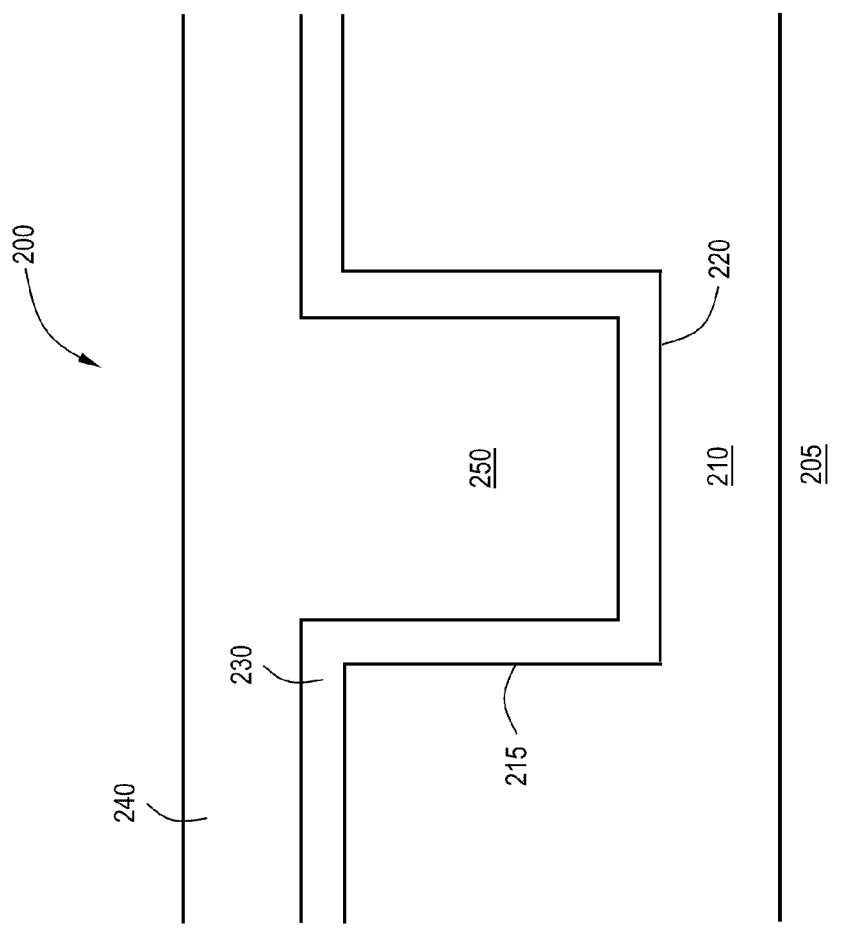
FIG. 2 illustrates a dielectric layer after deposition of a barrier layer and conductive fill material in accordance with one or more embodiments of the invention.

Accordingly, one aspect of the invention relates to a microelectronic device comprising a substrate, a dielectric layer, a barrier and/or seed layer, and a conductive material. FIG. 2 depicts an embodiment of a microelectronic device 200 comprising a substrate 205 and a dielectric layer 210. In one or more embodiments, the dielectric layer 210 is a low-k dielectric layer. In some embodiments, the dielectric layer comprises $SiO_x$. Further embodiments provide that the dielectric layer comprises porous carbon-doped $SiO_x$. In one or more embodiments, the dielectric layer is a porous carbon-doped $SiO_x$ layer with a k value less than 3. The dielectric layer 210 is disposed upon the substrate 205, and the dielectric layer 210 has a trench 250 defined by a trench bottom 220, sidewalls 215. A barrier/seed layer 230, which covers at least a portion of the sidewall 215 and/or trench bottom 220. As shown in the figure, the barrier layer 230 may cover the entirety of the sidewall 215 and trench bottom 220. In some embodiments, the barrier/seed layer 230 may comprise $CoN_x$. In some embodiments, the barrier/seed layer 230 may also comprise one or more dopants such as Ta, Al, Mg, Cr, Nb, Ti or V.

A conductive fill material 240 fills at least a portion of the trench 250 lined with barrier layer 230. According to one or more embodiments, the conductive fill material may comprise a film consisting essentially of cobalt, as deposited according to one or more of the methods described above. In other embodiments, the conductive fill material further comprises Al. Although the conductive fill material 240 in FIG. 2 is shown in direct contact with the barrier layer 230, intermediate layers may be in between the conductive fill material 240 and the barrier layer 230, such as adhesion layers or seeding layers.

The films in accordance with various embodiments of this invention can be deposited over virtually any substrate material. A "substrate surface," as used herein, refers to any substrate or material surface formed on a substrate upon which film processing is performed during a fabrication process. For example, a substrate surface on which processing can be performed include materials such as silicon, silicon oxide, strained silicon, silicon on insulator (SOI), carbon doped silicon oxides, silicon nitride, doped silicon, germanium, gallium arsenide, glass, sapphire, and any other materials such as metals, metal nitrides, metal alloys, and other conductive materials, depending on the application. Barrier layers, metals or metal nitrides on a substrate surface include titanium, titanium nitride, tungsten nitride, tantalum and tantalum nitride, aluminum, copper, or any other conductor or conductive or non-conductive bather layer useful for device fabrication. Substrates may have various dimensions, such as 200 mm or 300 mm diameter wafers, as well as, rectangular or square panes. Substrates on which embodiments of the invention may be useful include, but are not limited to semiconductor wafers, such as crystalline silicon (e.g., Si<100> or Si<111>), silicon oxide, strained silicon, silicon germanium, doped or undoped polysilicon, doped or undoped silicon wafers, III-V materials such as GaAs, GaN, InP, etc. and patterned or non-patterned wafers. Substrates may be exposed to a pretreatment process to polish, etch, reduce, oxidize, hydroxylate, anneal and/or bake the substrate surface.

As embodiments of the invention provide a method for depositing or forming doped cobalt-containing films, a processing chamber is configured to expose the substrate to a sequence of gases and/or plasmas during the vapor deposition process. The processing chamber would include separate supplies of reactants, along with any supply of carrier, purge and inert gases such as argon and nitrogen in fluid communication with gas inlets for each of the reactants and gases. Each inlet may be controlled by an appropriate flow controller such as a mass flow controller or volume flow controller in communication with a central processing unit (CPU) that allows flow of each of the reactants to the substrate to perform a deposition process as described herein. The central processing unit may be one of any forms of a computer processor that can be used in an industrial setting for controlling various chambers and sub-processors. The CPU can be coupled to a memory and may be one or more of readily available memory such as random access memory (RAM), read only memory (ROM), flash memory, compact disc, floppy disk, hard disk, or any other form of local or remote digital storage. Support circuits can be coupled to the CPU to support the CPU in a conventional manner. These circuits include cache, power supplies, clock circuits, input/output circuitry, subsystems, and the like.

In atomic layer deposition type chambers, the substrate can be exposed to the first and second precursors either spatially or temporally separated processes. Temporal ALD is a traditional process in which the first precursor flows into the chamber to react with the surface. The first precursor is purged from the chamber before flowing the second precursor. In spatial ALD, both the first and second precursors are simultaneously flowed to the chamber but are separated spatially so that there is a region between the flows that prevents mixing of the precursors. In spatial ALD, the substrate must be moved relative to the gas distribution plate, or vice-versa.

The substrate can be processed in single substrate deposition chambers, where a single substrate is loaded, processed and unloaded before another substrate is processed. The substrate can also be processed in a continuous manner, like a conveyer system, in which multiple substrate are individually loaded into a first part of the chamber, move through the chamber and are unloaded from a second part of the chamber. The shape of the chamber and associated conveyer system can form a straight path or curved path. Additionally, the processing chamber may be a carousel in which multiple substrates are moved about a central axis and exposed to the deposition gases at different positions.

The co-reactants are typically in vapor or gas form. The reactants may be delivered with a carrier gas. A carrier gas, a purge gas, a deposition gas, or other process gas may contain nitrogen, hydrogen, argon, neon, helium, or combinations thereof. The various plasmas described herein, such as the nitrogen plasma or the inert gas plasma, may be ignited from and/or contain a plasma co-reactant gas.

In one or more embodiments, the various gases for the process may be pulsed into an inlet, through a gas channel, from various holes or outlets, and into a central channel. In one or more embodiments, the deposition gases may be sequentially pulsed to and through a showerhead. Alternatively, as described above, the gases can flow simultaneously through gas supply nozzle or head and the substrate and/or the gas supply head can be moved so that the substrate is sequentially exposed to the gases.

In another embodiment, a cobalt-containing film may be formed during plasma enhanced atomic layer deposition (PEALD) process that provides sequential pulses of precursors and plasma. In specific embodiments, the co-reactant may involve a plasma. In other embodiments involving the use of plasma, during the plasma step the reagents are generally ionized during the process, though this might occur only upstream of the deposition chamber such that ions or other energetic or light emitting species are not in direct contact with the depositing film, this configuration often termed a remote plasma. Thus in this type of PEALD process, the plasma is generated external from the processing chamber, such as by a remote plasma generator system. During PEALD processes, a plasma may be generated from a microwave (MW) frequency generator or a radio frequency (RF) generator. Although plasmas may be used during the deposition processes disclosed herein, it should be noted that plasmas are not required. Indeed, other embodiments relate to deposition processes under very mild conditions without a plasma.

Another aspect of the invention pertains to an apparatus for deposition of a film on a substrate to perform a process according to any of the embodiments described above. In one embodiment, the apparatus comprises a deposition chamber for deposition of a film on a substrate. The chamber comprises a process area for supporting a substrate. The apparatus includes a precursor inlet in fluid communication with a supply of a cobalt precursor, such as cobalt [bis(bis(trimethylsilyl)amide]. The apparatus also includes a reactant gas inlet in fluid communication with a supply of nitrogen-containing co-reactant, such as ammonia. The apparatus may also include a reactant gas inlet in fluid communication with a supply of dopant precursor, such as a dopant-containing metal complex. The apparatus further includes a purge gas inlet in fluid communication with a purge gas. The apparatus can further include a vacuum port for removing gas from the deposition chamber. The apparatus can further include an auxiliary gas inlet for supplying one or more auxiliary gases such as inert gases to the deposition chamber. The deposition can further include a means for heating the substrate by radiant and/or resistive heat.

In some embodiments, a plasma system and processing chambers or systems which may be used during methods described here for depositing or forming the films can be performed on either PRODUCER®, CENTURA®, or ENDURA® systems, all available from Applied Materials, Inc., located in Santa Clara, Calif. A detailed description of an ALD processing chamber may be found in commonly assigned U.S. Pat. Nos. 6,821,563, 6,878,206, 6,916,398, and 7,780,785.

Reference throughout this specification to "one embodiment," "certain embodiments," "one or more embodiments" or "an embodiment" means that a particular feature, structure, material, or characteristic described in connection with the embodiment is included in at least one embodiment of the invention. Thus, the appearances of the phrases such as "in one or more embodiments," "in certain embodiments," "in one embodiment" or "in an embodiment" in various places throughout this specification are not necessarily referring to the same embodiment of the invention. Furthermore, the particular features, structures, materials, or characteristics may be combined in any suitable manner in one or more embodiments.

Although the invention herein has been described with reference to particular embodiments, it is to be understood that these embodiments are merely illustrative of the principles and applications of the present invention. It will be apparent to those skilled in the art that various modifications and variations can be made to the method and apparatus of the present invention without departing from the spirit and scope of the invention. Thus, it is intended that the present invention include modifications and variations that are within the scope of the appended claims and their equivalents.

EXAMPLE

A film was successfully deposited using a $(TMSA)_2Co(THF)$ precursor and $NH_3$ co-reactant in a pulsed CVD mode. The deposition chamber was held at 200° C. No film deposited when no ammonia was added, indicating that there is at least some CVD nature with the $NH_3$ reaction. Accordingly, it is evident that the deposition is caused by the reaction of the precursor with ammonia and not by thermal decomposition.

What is claimed is:

1. A method of depositing a cobalt-containing film, the method comprising exposing a substrate surface to a precursor and a co-reactant to provide a cobalt-containing film, the first precursor having a structure represented by:

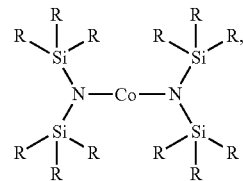

wherein each R is independently C1-C6 substituted or un-substituted alkanes, branched or un-branched alkanes, substituted or un-substituted alkenes, branched or un-branched alkenes, substituted or un-substituted alkynes, branched or un-branched alkynes or substituted or un-substituted aromatics.

2. The method of claim 1, wherein each R group is methyl.

3. The method of claim 1, wherein the R groups on a given silicon atom are not the same.

4. The method of claim 1, wherein the co-reactant comprises $NH_3$, hydrazine, a substituted hydrazine, a primary amine, a secondary amine, a tertiary amine, a $N_2$ plasma or an ammonia plasma.

5. The method of claim 4, wherein the cobalt-containing film comprises $CoN_x$, wherein x ranges from about 0.1 to about 3.

6. The method of claim 1, wherein the co-reactant comprises a reducing agent selected from the group consisting of alane, $H_2$, $H_2$ plasma and Ar plasma.

7. The method of claim 6, wherein the cobalt-containing film consists essentially of Co.

8. The method of claim 6, wherein the substrate comprises silicon, and the cobalt-containing film comprises cobalt silicide.

9. The method of claim 1, further comprising depositing a layer comprising copper over the cobalt-containing film.

10. A method of depositing a cobalt-containing film, the method comprising exposing a substrate surface to a precursor and a co-reactant, the first precursor having a structure represented by:

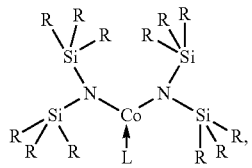

wherein each R is independently C1-C6 substituted or un-substituted alkanes, branched or un-branched alkanes, substituted or un-substituted alkenes, branched or un-branched alkenes, substituted or un-substituted alkynes, branched or un-branched alkynes or substituted or un-substituted aromatics, L is a coordinating ligand comprising a Lewis base.

11. The method of claim 10, wherein the coordinating ligand comprises pyridine, tetrahydrofuran, trimethylamine or triethylamine.

12. The method of claim 10, wherein each R group is methyl.

13. The method of claim 10, wherein the R groups on a given silicon atom are not the same.

14. The method of claim 10, wherein the co-reactant comprises NH$_3$, hydrazine, a substituted hydrazine, a primary amine, a secondary amine, a tertiary amine, a N$_2$ plasma or an ammonia plasma.

15. The method of claim 14, wherein the cobalt-containing film comprises CoN$_x$, wherein x ranges from about 0.1 to about 3.

16. The method of claim 10, wherein the co-reactant comprises a reducing agent selected from the group consisting of alane, H$_2$, H$_2$ plasma or Ar plasma.

17. The method of claim 16, wherein the cobalt-containing film consists essentially of Co.

18. The method of claim 16, wherein the substrate comprises silicon, and the cobalt-containing film comprises cobalt silicide.

19. The method of claim 10, further comprising depositing a layer comprising copper over the cobalt-containing film.

20. A method of depositing a cobalt-containing film, the method comprising exposing a substrate surface to a precursor and a co-reactant comprising NH$_3$ to provide a cobalt-containing film, the first precursor having a structure represented by:

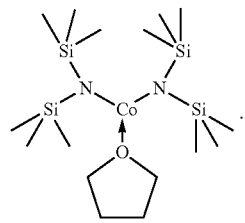

* * * * *